(12) United States Patent
Lorentz et al.

(10) Patent No.: US 8,498,089 B2
(45) Date of Patent: Jul. 30, 2013

(54) APPARATUS AND METHOD FOR SENSING A CURRENT WITHIN A COIL

(75) Inventors: Vincent Lorentz, Erlangen (DE); Sven Berberich, Spardorf (DE); Martin Maerz, Nuremberg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 843 days.

(21) Appl. No.: 12/548,795

(22) Filed: Aug. 27, 2009

(65) Prior Publication Data

US 2010/0052637 A1 Mar. 4, 2010

(30) Foreign Application Priority Data

Aug. 27, 2008 (DE) .......................... 10 2008 044 634

(51) Int. Cl.
*H01H 47/00* (2006.01)
*G05F 1/573* (2006.01)

(52) U.S. Cl.
USPC .......................................... 361/152; 323/277

(58) Field of Classification Search
USPC .......................................................... 361/152
See application file for complete search history.

(56) References Cited

U.S. PATENT DOCUMENTS 7,151,361 B2 * 12/2006 Xi ................................. 323/222

FOREIGN PATENT DOCUMENTS

DE 19520735 A1 12/1996
DE 102006039413 A1 3/2008

* cited by examiner

*Primary Examiner* — Dharti Patel
(74) *Attorney, Agent, or Firm* — Michael A. Glenn; Glenn Patent Group

(57) ABSTRACT

A method of sensing a current within a coil, said current being applied to the coil such that it is switched via a switching transistor, includes a detection transistor, a circuit and a control element. The detection transistor is configured to sense the current. The circuit is configured to provide, at a predetermined point in time during a current sensing period, a voltage across the switching transistor. The control element is configured to match, in response to the voltage provided by the circuit, the working points of the switching transistor and of the detection transistor, and to output an output signal which corresponds to the current to be sensed.

17 Claims, 10 Drawing Sheets

APPARATUS AND METHOD FOR SENSING A CURRENT WITHIN A COIL

CROSS-REFERENCE TO RELATED APPLICATIONS

This application claims priority to German Patent Application No. 102008044634.3-35 filed 27 Aug. 2008, which is incorporated herein by reference in its entirety.

BACKGROUND OF THE INVENTION

The present invention relates to an apparatus and a method for sensing a current within a coil, said current being applied to the coil such that it is switched via a switching transistor.

In a system, a current value may be sensed, for example, for detecting an overload operation or a short-circuit. However, the current value may also be used as a controlled variable, such as in regulated current sources. Potential fields of application of the invention are any kinds of voltage and current transformers, in particular CMOS-integrated DC/DC converters.

So that the design volume of the passive devices in the power supply part in mobile systems may be further reduced, it may be useful, for example, to further increase the switching frequency employed in DC/DC converters. In such voltage supply parts it is important to monitor the values of the currents flowing in the various circuit parts, for example to detect the system being overloaded or to check a regulated current source for charging a lithium ion accumulator. In these applications, what is particularly important is the average value of the current flowing in the power path, viewed over a clock period.

To perform a current measurement, the current value is often first of all converted to a proportional voltage value, e.g. using a resistor or a Hall sensor, since voltages are easier to evaluate, for example by means of an analog/digital converter (ADC). At high clock frequencies, measuring currents becomes particularly problematic. Current sensors comprising operational amplifiers having large bandwidths may be used. Such operational amplifiers consume a considerable amount of quiescent current, which negatively affects the efficiency factor of the entire DC/DC converter. If, in addition, the average value of the current may be used for the application, it may be useful to either calculate this value in a digital manner or to integrate it in an analog manner. This results in the requirement of a costly and complex circuit, which will also consume a large amount of energy.

The requirements placed on a current sensor applied in mobile systems typically comprise low energy absorption and high accuracy. If the current sensor is to operate even at high switching frequencies, the signal/noise ratio may become problematic, since relatively steep switching edges generate electromagnetic interference. If the current sensor is employed in power converters for battery-operated mobile devices, it should be insensitive to temperature changes and ensure high accuracy over the entire battery voltage range. To combine said requirements within one sensor represents a major challenge.

This problem is to be discussed in further detail by means of an example: for modern mobile devices, lithium ion batteries are mostly employed, which provide a nominal voltage of about 3.6 V. When the battery cell is fully charged, it even has a voltage of 4.2 V. The period duration of a 10 MHz DC/DC converter is 100 ns, of which about 1/10 of the period is used up by the switching transients. This means that the rising and falling edges each have a maximum duration of about 10 ns. If the switched voltage of 4.2 V is to be set at the operational amplifier, this will correspond to a slew rate of 420 V/μs (4.2 V/10 ns). The current consumption of such an operational amplifier ranges from 5 to 10 mA. To ensure low signal distortion, the frequency bandwidth should at least range from 50 to 100 MHz. A mobile telephone has a quiescent current consumption in the range from 3 to 6 mA, for example. If the current sensor causes an additional current consumption of 5-10 mA, this represents a duplication of the overall current consumption. This results in that about half up to three quarters of the battery energy would be consumed within the current sensor, which would be extremely unsuitable for a mobile application. Therefore, in this context, a current sensor would be desirable which enable measuring the average value of the current without requiring devices having high bandwidths, i.e. having high current consumptions at the same time.

In mobile systems, sampling of currents which are switched at a high frequency represents a particular challenge, since the energy consumption of the current sensor should be kept as low as possible. FIGS. 1a-1d depict the current measurement variants currently complying with conventional technology which are employed in integrated DC/DC converters. As an example, a buck-converter topology was selected which has a power switch $M_1$, a power diode $D_1$, and a power coil $L_1$. The input voltage $V_{in}$ is also the supply voltage, which in mobile devices corresponds to the battery voltage and is converted to the output voltage $V_{out}$. A capacitor $C_{out}$ smoothens the output voltage $V_{out}$.

In FIG. 1a, a power switch $M_1$ is connected between a voltage input 10 and a branching node 12. The power switch $M_1$ comprises a control input 14 to which a control signal may be applied in order to switch it. A coil $L_1$ and a resistor $R_s$ are connected in series between the branching node 12 and a voltage output 16. A power diode $D_1$ is reverse-connected between the branching node 12 and a reference node 18. A capacitor $C_{out}$ is connected between the voltage output 16 and the reference node 18. An input voltage $V_{in}$, or a supply voltage, is present at the voltage input 10. A current $I_{D(M1)}$ flows through the power switch $M_1$. An output voltage $V_{out}$ is available at the voltage output 16. The voltage $V_{sense}$ may be measured across the resistor $R_s$.

The current sensor in FIG. 1a comprises a resistor $R_s$ across which the voltage $V_{sense}$ is measured. As is described in Ohm's law, the measured voltage $V_{sense}$ is proportional to the current value $I_{L1}$. The proportionality constant is the selected resistance, which is well defined. This current sensor enables measuring the present current value $I_{D(M1)}$ within the power switch $M_1$ with high accuracy. However, this method has many disadvantages. Since the resistor $R_s$ is located within the current path, it causes line losses which increase as a square of the flowing current $I_{L1}$.

In FIG. 1b, a power switch $M_1$ is connected between a voltage input 20 and a branching node 22. A coil $L_1$ is connected between the branching node 22 and a voltage output 26. A power diode $D_1$ is reverse-connected between the branching node 22 and a reference node 28. A capacitor $C_{out}$ is connected between the voltage output 26 and the reference node 28. An input voltage $V_{in}$ is present at the voltage input 20, an output voltage $V_{out}$ is available at the voltage output 26. The power switch $M_1$ comprises a control input 24 to which a control signal may be applied so as to switch the power switch $M_1$. A current $I_{D(M1)}$ flows through the power switch $M_1$. A current $I_{L1}$ flows through the coil $L_1$. A voltage drop $V_{sense}$ across the power switch $M_1$ may be measured.

The current sensor in FIG. 1b samples the voltage drop $V_{sense}$ across the power switch $M_1$. This method causes no additional line losses within the current path, but the accuracy that may be achieved is substantially lower, since the voltage drop $V_{sense}$ is highly dependent on the temperature and on the drive. Due to the fact that the power switch $M_1$ is switched, the current flowing through it will undergo intense dynamic changes. Delay times are to be taken into account for the current sensor so that the current measured has achieved a stable value.

In FIG. 1c, a power switch $M_1$ is connected between a voltage input 30 and a branching node 32. The power switch $M_1$ comprises a control input 34 to which a control signal may be applied to switch the power switch $M_1$. A coil $L_1$ is connected between the branching node 32 and a voltage output 36. A power diode $D_1$ is reverse-connected between the branching node 32 and a reference node 38. A capacitor $C_{out}$ is connected between the voltage output 36 and the reference node 38. In parallel with the coil $L_1$, a second capacitor $C_s$ and a resistor $R_s$ are connected in series between the branching node 32 and the voltage output 36. An input voltage $V_{in}$ is present at the voltage input 30, an output voltage $V_{out}$ is available at the voltage output 36. A current $I_{D(M1)}$ flows through the power switch $M_1$. A current $I_{L1}$ flows through the coil $L_1$. A voltage $V_{sense}$ may be measured across the second capacitor $C_s$.

The current sensor in FIG. 1c samples the voltage $V_{sense}$ at the coil $L_1$ via a low-pass filter ($R_s$, $C_s$). The voltage $V_{sense}$ at the output of the low-pass filter is an image of the current $I_{L1}$ through the coil $L_1$. This method causes hardly any additional line losses in the current path. However, the low-pass filter ($R_s$, $C_s$) is to be precisely adapted to the coil $L_1$. To this end, highly precise passive devices ($R_s$, $C_s$) are to be employed which mostly may only be employed in a discrete design. This means that this method is not suitable for a monolithically integrated DC/DC converter.

In FIG. 1d, a power switch $M_1$ is connected between a voltage input 40 and a branching node 42. The power switch $M_1$ comprises a control input 44 to which a control signal may be applied to switch the power switch $M_1$. A coil $L_1$ is connected between the branching node 42 and a voltage output 46. A power diode $D_1$ is reverse-connected between the branching node 42 and a reference node 48. A capacitor $C_{out}$ is connected between the voltage output 46 and the reference node 48. A sensor switch $M_{1a}$ is connected between the voltage input 40 and a sensor output 50. The sensor switch $M_{1a}$ comprises a sensor control input 52 which is interconnected to the control input 44 of the power switch $M_1$. A current $I_{D(M1)}$ flows through the power switch $M_1$. A current $I_{L1}$ flows through the coil $L_1$, and a current $I_{sense}$ flows through the sensor switch $M_{1a}$.

The current sensor in FIG. 1d samples the current $I_{D(M1)}$ over a current mirror ($M_1$, $M_{1a}$). The current mirror ($M_1$, $M_{1a}$) generates a proportional current $I_{sense}$ which is smaller, by a factor of about 10 to 10,000, than the current $I_{D(M1)}$ to be measured. This method may easily be implemented in CMOS circuits. However, it offers only a low level of accuracy if the two switches ($M_1$, $M_{1a}$) within the current mirror do not have the same working point.

To remedy the problem of the lack of accuracy of the current sensor in FIG. 1d, it is customary to match the working points of the two switches ($M_1$, $M_{1a}$) within the current mirror. This principle is shown in FIG. 2.

In a conventional current sensor, shown in FIG. 2, for example, the voltage $V_{SW1}$ at the power coil $L_1$ is connected between ground $V_{SSA}$ and supply voltage $V_{in}$. If a 10 MHz pulse width modulation (PWM) signal is employed, for example, to drive the control input 64 of the power switch $M_1$ with a control signal $V_{G(M1)}$, the operational amplifier 74 should have a very high bandwidth. This means high energy consumption, which restricts application in mobile devices, since this energy is also consumed in the standby mode of the mobile device. Therefore, the operating period would be highly reduced.

FIG. 2 shows the conventional current sensor 60, which matches the working points of a power switch $M_1$ and of a sensor switch $M_{1a}$. The conventional current sensor 60 comprises a sensor switch $M_{1a}$, an operational amplifier 74, a measuring transistor $M_{1b}$ and a sensor resistor $R_{sense}$. A power switch $M_1$ is connected between a voltage input 61 and a branching node 62. The power switch $M_1$ comprises a control input 64 to drive the power switch $M_1$ by means of a control signal $V_{G(M1)}$. A power diode $D_1$ is reverse-connected between the branching node 62 and a reference node 68. In parallel with the power diode $D_1$, a series connection of a (power) coil $L_1$ and an output capacitor $C_{out}$ is connected between the branching node 62 and the reference node 68. An output voltage $V_{out}$ is available between the coil $L_1$ and the output capacitor $C_{out}$. The sensor switch $M_{1a}$ is switched such that an input of the sensor switch $M_{1a}$ is interconnected to an input of the power switch $M_1$, both inputs being connected to the voltage input 61. The sensor switch $M_{1a}$ comprises a sensor control input 72 connected to the control input 64 of the power switch $M_1$. The control signal $V_{G(M1)}$ is present at the sensor control input 72 and at the control input 64.

The operational amplifier 74 comprises a negative input connected to an output of the sensor switch $M_{1a}$, and a positive input connected to the branching node 62. The measuring transistor $M_{1b}$ comprises a measuring transistor control input 76 connected to an output of the operational amplifier 74. An input of the measuring transistor $M_{1b}$ is connected to the output of the sensor switch $M_{1a}$ and to the negative input of the operational amplifier 74. An output of the measuring transistor $M_{1b}$ is connected to the reference node 68 via a sensor resistor $R_{sense}$.

An input voltage $V_{in}$ is present at the voltage input 61. A current $I_{D(M1)}$ flows through the power switch $M_1$. A sensor current $I_{sense}$ flows through the sensor switch $M_{1a}$. A coil current $I_{L1}$ flows through the coil $L_1$. A voltage $V_{SW1}$ drops at the branching node 62. A sensor voltage $V_{sense}$ drops at the sensor resistor $R_{sense}$.

The current $I_{sense}$, which is an image of the current $I_{D(M1)}$, generates the voltage $V_{sense}$ by means of the resistor $R_{sense}$. An operational amplifier 74 having a high bandwidth is employed to minimize the voltage difference between the two switches of the current mirror. If high clock frequencies are employed for the power switch $M_1$, the operational amplifier 74 should offer a large bandwidth. Operational amplifiers having large bandwidths consume a large amount of energy, however, which renders them unsuitable for being employed in mobile systems.

A typical DC/DC voltage converter, for which a full-bridge topology is employed, is depicted in FIG. 3. FIG. 3 shows a circuit diagram of a conventional full-bridge circuit in a buck mode topology. The full-bridge circuit 100 comprises a power input circuit 101, an H bridge circuit 102, which is configured in buck mode topology, a power output circuit 103, and a pulse width modulation control circuit 104 which is operated in a voltage mode.

The power input circuit 101 comprises a voltage source 108 connected between a reference node 109 and an output 110 of the power input circuit 101. An input voltage $V_{in}$ is generated at the voltage source 108, and an input current $I_{in}$ is provided at the output 110.

The H bridge circuit 102 comprises four power switches $M_1$, $M_2$, $M_3$, $M_4$, a coil $L_1$, and an output capacitor $C_{out}$. A first input 111 of the H bridge circuit 102 is interconnected to the output 110 of the power input circuit 101. The H bridge circuit 102 comprises a second input 112 and an output 113.

The first power switch $M_1$ is connected between the first input 111 and a first branching node 116 of the H bridge circuit 102. The first power switch $M_1$ comprises a first control input 120 interconnected with the second input 112 of the H bridge circuit 102. The second power switch $M_2$ is connected between the first branching node 116 and a reference node 109 of the H bridge circuit 102. The second power switch $M_2$ comprises a control input 122 connected to the reference node 109. The coil $L_1$ is connected between the first branching node 116 and a second branching node 118. The third power switch $M_3$ is connected between the second branching node 118 and the reference node 109. The third power switch $M_3$ comprises a control input 124 connected to the reference node 109. The fourth power switch $M_4$ is connected between the second branching node 118 and the output 113 of the H bridge circuit 102 and comprises a control input 126 connected to the reference node 109. The output capacitor $C_{out}$ is connected between the output 113 of the H bridge circuit 102 and the reference node 109. A current $I_{L1}$ flows through the coil $L_1$. The control input 120 of the first power switch $M_1$ receives a control signal PWM BUCK.

The power output circuit 103 comprises an output impedance $Z_{out}$ connected between an input 130 of the power output circuit 103 and a reference node 109 of the power output circuit 103. The input 130 of the power output circuit 103 is connected to the output 113 of the H bridge circuit 102. The input 130 of the power output circuit 103 receives an output current $I_{out}$ flowing through the output impedance $Z_{out}$, so that an output voltage $V_{out}$ drops at the output impedance $Z_{out}$.

The pulse width modulation control circuit 104 comprises a reference voltage source 140, an operational amplifier 142, a comparator 144, a first feedback resistor $R_{FB1}$ and a second feedback resistor $R_{FB2}$. The pulse width modulation control circuit 104 comprises an input 146 connected to the output 113 of the H bridge circuit 102 and to the input 130 of the power output circuit 103. The pulse width modulation control circuit 104 comprises an output 148 connected to the second input 112 of the H bridge circuit 102.

The reference voltage source 140 is connected between a positive input of the first operational amplifier 142 and a reference node 109 of the pulse width modulation control circuit 104. The reference voltage source 140 generates a reference voltage $V_{ref}$. A negative input of the operational amplifier 142 is connected to a branching node 150 of the pulse width modulation control circuit 104. An output of the operational amplifier 142 is connected to a negative input of the comparator 144. A fault voltage $V_{EA}$ is present at the negative input of the comparator 144, an oscillator voltage $V_{OSC}$ is present at a positive input of the comparator 144. The output of the comparator 144 is connected to the output 148 of the pulse width modulation control circuit 104 and provides the control signal PWM BUCK. The first feedback resistor $R_{FB1}$ is connected between the branching node 150 of the pulse width modulation control circuit 104 and the reference node 109. The second feedback resistor $R_{FB2}$ is connected between the input 146 and the branching node 150 of the pulse width modulation control circuit 104. A feedback voltage $V_{FB}$ drops at the first feedback resistor $R_{FB1}$. The reference nodes 109 of the four circuits 101, 102, 103, 104 are at ground potential.

A full bridge comprises a discrete power coil $L_1$ connected to four power switches ($M_1$, $M_2$, $M_3$, $M_4$). The impedance of the load $Z_{out}$ is connected to the output voltage $V_{out}$. The output voltage $V_{out}$ is adjusted by a voltage divider which is based on resistors ($R_{FB1}$, $R_{FB2}$) and which generates the feedback voltage $V_{FB}$. A fault amplifier 142 amplifies the voltage difference between the feedback voltage $V_{FB}$ and the reference voltage $V_{ref}$ and thus generates a fault voltage $V_{EA}$. A pulse width modulator (PWM modulator) 104 generates the PWM pulses (PWM BUCK) on the basis of the fault voltage $V_{EA}$ and of the carrier signal $V_{osc}$.

The full-bridge topology enables realizing the buck converter, boost converter and buck-boost converter topologies.

At high clock frequencies, which may be used in the full-bridge circuit, utilization of a conventional current sensor of FIG. 2 in the full-bridge circuit of FIG. 3 may render precise measurement of currents extremely expensive. For precise measurement of the currents, operational amplifiers having high bandwidths may be used which consume a large amount of quiescent current and may therefore negatively affect the efficiency factor of the entire bridge circuit. If the average value of the current may be used, a further circuit may be used for determining this value, which circuit will then consume further energy. At high switching frequencies, the signal/noise ratio may deteriorate due to the relatively steep switching edges and to the electromagnetic interference effects associated therewith, and may impair the accuracy of the current measurement.

SUMMARY

According to an embodiment, an apparatus for sensing an average value of a switched current within a coil, wherein said current may be applied to the coil such that it is switched via a switching transistor, may have: a detection transistor; a circuit configured to sample, at a predetermined point in time, a voltage which corresponds to a voltage across the switching transistor, and to provide a holding voltage; and a control element configured to match, in response to the holding voltage provided by the circuit, the working points of the switching transistor and of the detection transistor, and to output, as a function of a current through the detection transistor, an output signal which is a measure of the average value of the switched current.

According to an embodiment, a method of sensing an average value of a switched current within a coil, said current being applied to the coil such that it is switched via a switching transistor, may have the steps of: providing a holding voltage, wherein providing the holding voltage includes sampling and holding a voltage which corresponds to a voltage across the switching transistor; matching working points of the switching transistor ($M_1$) and of a detection transistor in response to the holding voltage provided; and outputting an output signal, which is a measure of the average value of the switched current, as a function of a current through the detection transistor.

Embodiments of the invention measure the average value of a switched current within a coil by means of the active electronic switch with very low supplementary losses, and consume considerably less energy as compared to conventional current sensors.

Embodiments of the invention further comprise two similar electronic switches, e.g. transistors, an operational amplifier, and a sample-and-hold circuit (simply referred to as circuit below). This current sensor may be realized both in a discrete and in an integrated manner.

Embodiments of the present invention solve the technical problem by means of a current sensor which samples the average value of the current $I_{L1}$ within the coil $L_1$ without requiring an operational amplifier having a large bandwidth, not even at high switching frequencies. The inventive current sensor may be employed in low-frequency converters, e.g. power supply units for computers, and in high-frequency converters, e.g. DC/DC converters for mobile telephones, and consumes only very little quiescent current. The inventive current sensor may be realized both as a discrete electronic circuit, as a discrete electronic device, or monolithically as part of an integrated circuit. The integrated variant may be realized without any additional process expenditure during production.

BRIEF DESCRIPTION OF THE DRAWINGS

Embodiments of the present invention will be detailed subsequently referring to the appended drawings, in which:

FIG. 6b shows a circuit diagram of an oscillator in accordance with FIG. 6a;

DETAILED DESCRIPTION OF THE INVENTION

Figure 4:
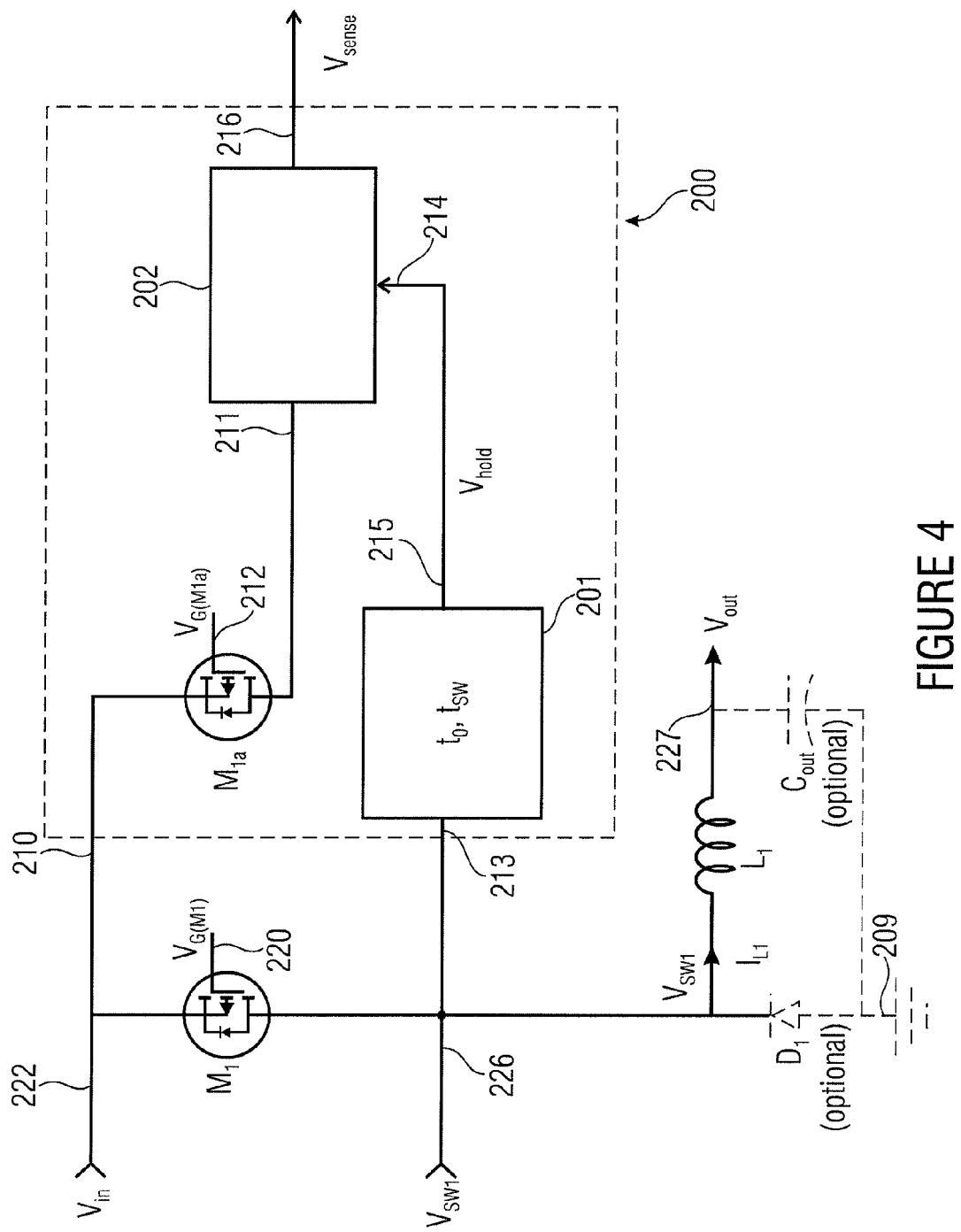
FIG. 4 shows a circuit diagram of an apparatus for sensing a current within a coil in accordance with an embodiment of the invention.

FIG. 4 shows a circuit diagram of an apparatus for sensing a current within a coil in accordance with an embodiment of the invention. The apparatus 200 comprises a detection transistor $M_{1a}$, a circuit 201, and a control element 202, and has two inputs 210, 213, and an output 215.

The detection transistor $M_{1a}$ is connected between a first input 210 of the apparatus 200 and an input 211 of the control element 202. The detection transistor $M_{1a}$ comprises a control input 212 at which a detection transistor control voltage $V_{G(M1a)}$ is present. The circuit 201 comprises an input 213 corresponding to a second input 213 of the apparatus 200. The circuit 201 comprises an output 215 interconnected to a control input 214 of the control element 202. The control element 202 comprises an input 211, a control input 214, and an output 216 which corresponds to an output 216 of the apparatus 200. At the output 215 of the circuit 201, a holding voltage $V_{hold}$ is output which is present at the control input 214 of the control element 202. A sensor voltage $V_{sense}$ may be measured at the output 216 of the control element 202.

A power switch $M_1$, which comprises a control input 220 at which a control voltage $V_{G(M1)}$ is present, is connected between the first input 210 and the second input 213 of the apparatus 200. The first input 210 of the apparatus 200 is connected to a voltage input 222 at which an input voltage $V_{in}$ is present. The second input 213 of the apparatus 200 is connected to a branching node 226 at which a branching voltage $V_{SW1}$ drops. A coil $L_1$, through which a coil current $I_{L1}$ flows, is connected between the branching node 226 and an output node 227. An output voltage $V_{out}$ drops at the output node 227. An optional diode $D_1$ is reverse-connected between the branching node 226 and a reference node 209. An optional output capacitor $C_{out}$ is connected between the output node 227 and the reference node 209.

Figure 5:
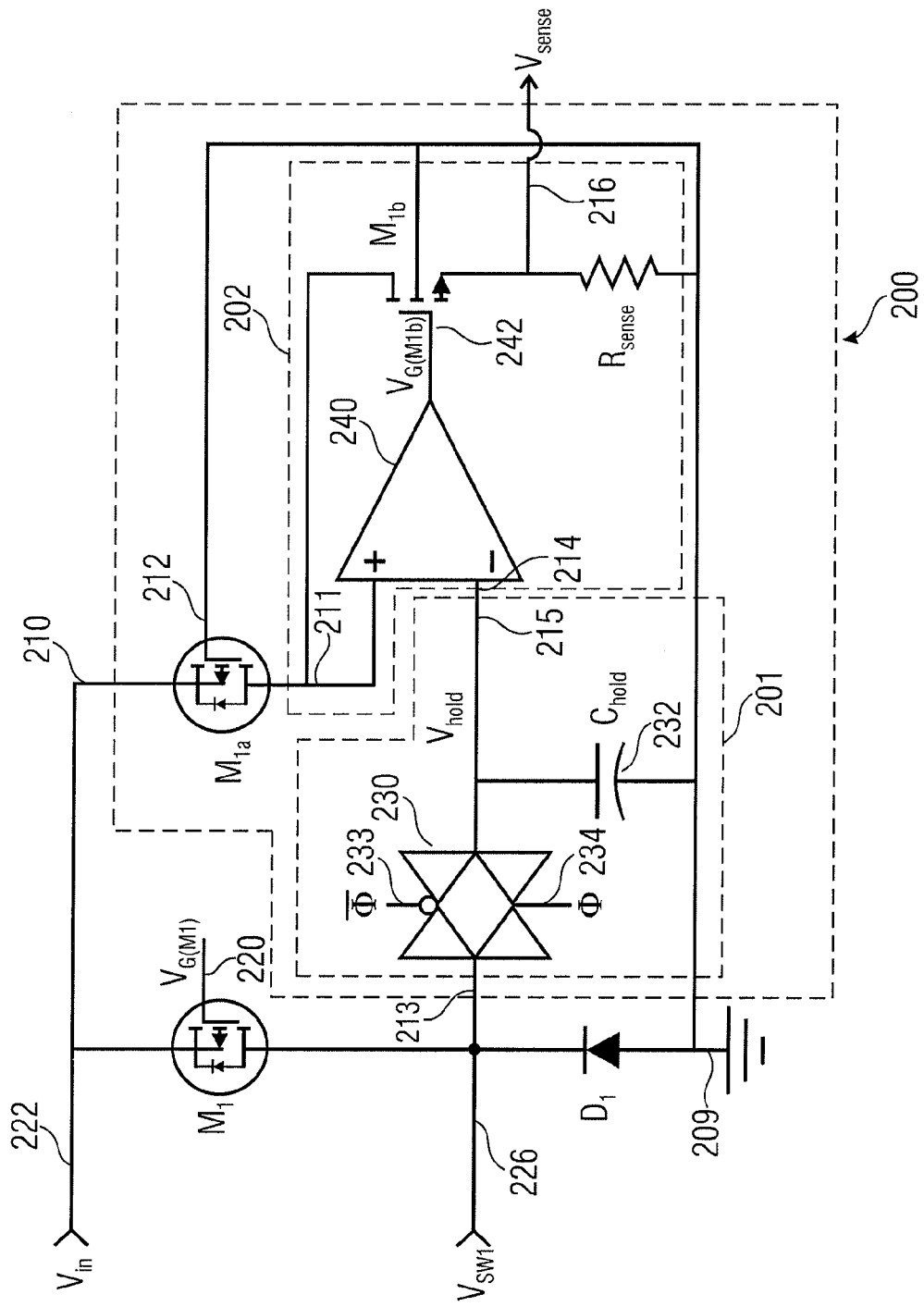
FIG. 5 shows a circuit diagram of an apparatus for sensing a current within a coil in accordance with a further embodiment of the invention.

FIG. 5 shows a circuit diagram of an apparatus for sensing a current within a coil in accordance with a further embodiment, wherein the circuit 201 of the apparatus 200 of FIG. 4 comprises a transmission element 230 and a storage element 232. The transmission element 230 comprises a transmission gate which is connected between the input 230 and the output 215 of the circuit 201 and is controlled by a gate control signal $\Phi$ and an inverse gate control signal $\bar{\Phi}$. The storage element 232 comprises a holding capacitor $C_{hold}$ connected between the output 215 of the circuit 201 and a reference node 209.

The control element 202 comprises an operational amplifier 240, a measuring transistor $M_{1b}$, and a sensor resistor $R_{sense}$. A positive input of the operational amplifier 240 is interconnected to the input 211 of the control element 202. A negative input of the operational amplifier 240 is interconnected to the control input 214 of the control element 202. An output of the operational amplifier 240 is interconnected to a control input 242 of the measuring transistor $M_{1b}$ and provides the control voltage $V_{G(M1b)}$ for the measuring transistor $M_{1b}$. The measuring transistor $M_{1b}$ is connected between the input 211 of the control element 202 and the output 216 of the control element 202 and acts—in the exemplary case of an implementation in the form of a field-effect transistor by means of its channel resistance—as a resistor, controllable via the control voltage $V_{G(M1b)}$, between the transistor $M_{1a}$ and the output 215. A sensor resistor $R_{sense}$ is connected between the output 216 of the control element 202 and the reference node 209. The reference node 209 is a shared reference node for the apparatus 200 and the coil $L_1$, which is connected across the power switch and has the apparatus 200 connected to it. FIG. 5 shows a diode $D_1$, but not the coil $L_1$, and the capacitor $C_{out}$ of FIG. 4. The external wiring to which the apparatus 200 is connected corresponds to the external wiring of FIG. 4, however. The reference node 209 is at ground potential; it may also be at any other reference potential.

Figure 1:
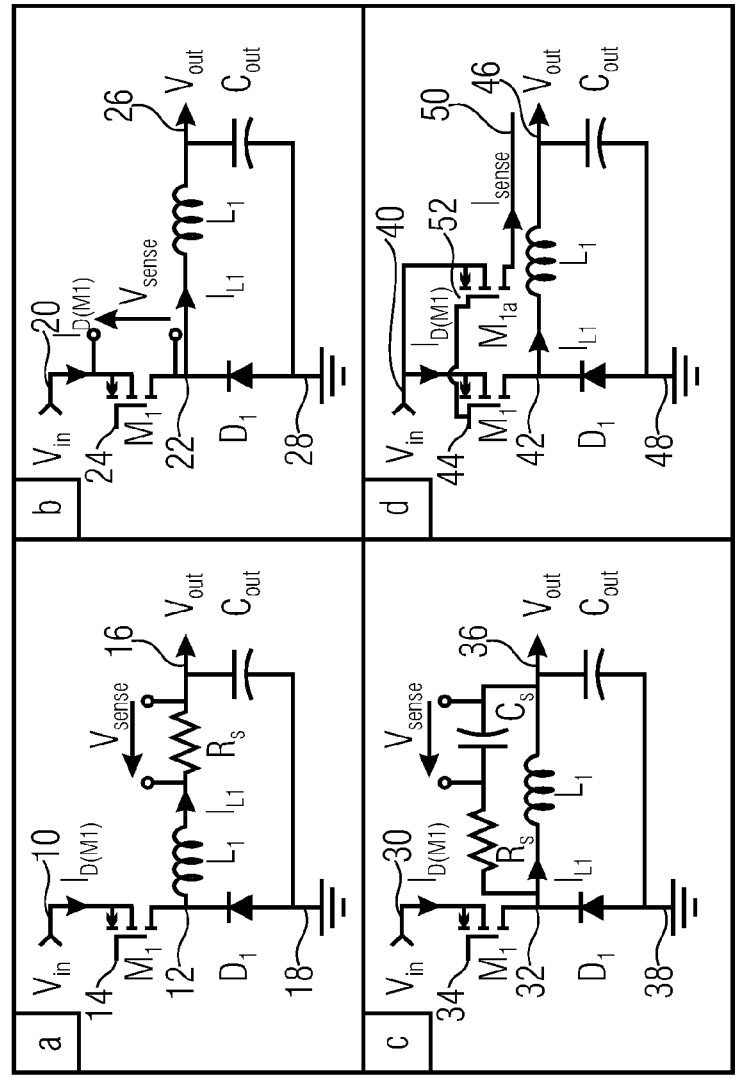
FIGS. 1a-d show circuit diagrams of conventional current sensors.
Figure 2:
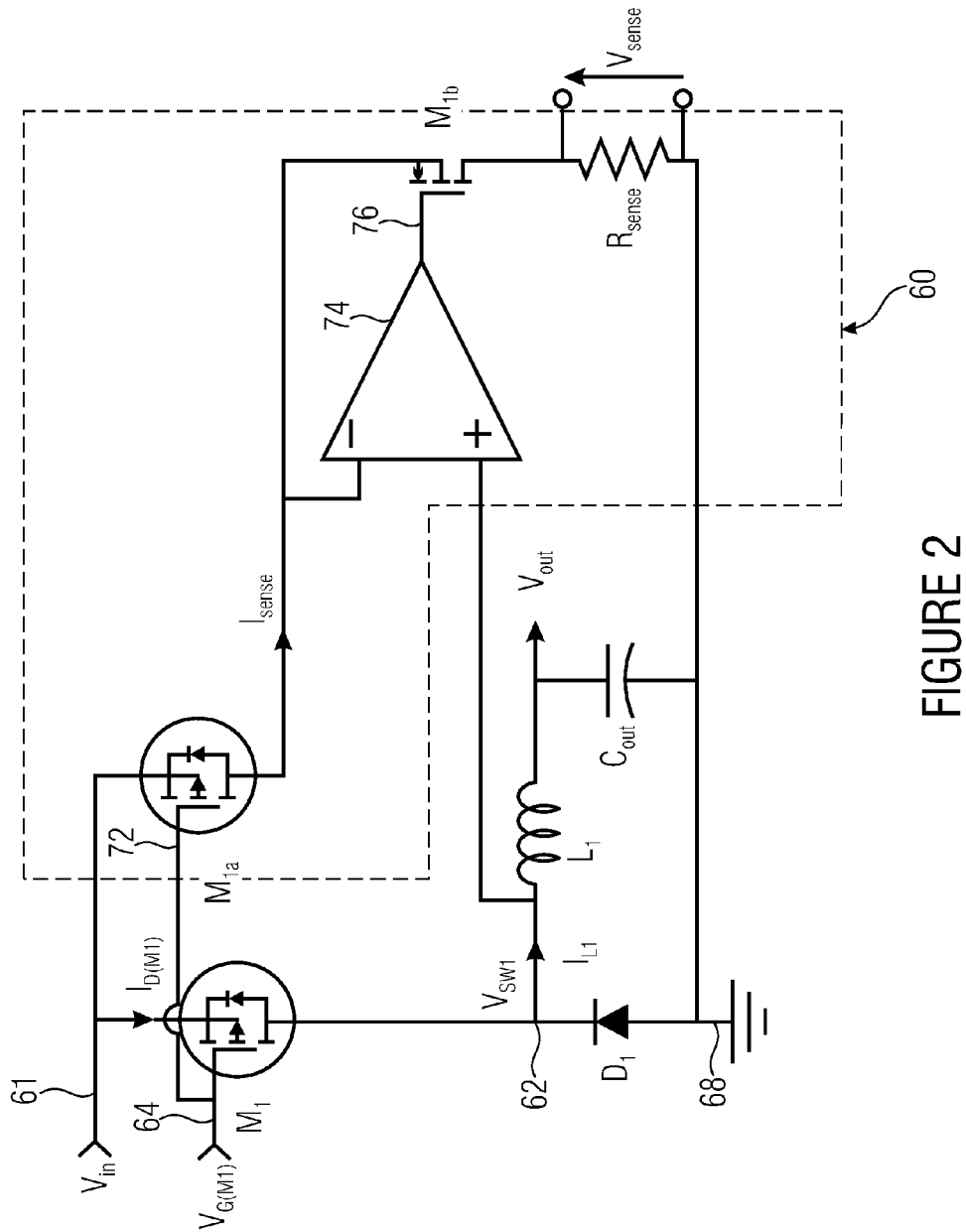
FIG. 2 shows a further circuit diagram of a conventional current sensor.

The current sensor 200 of FIG. 5 comprises the sensor switch $M_{1a}$, which is connected to the power switch $M_1$, and thus is a further development of the so-called "sensing MOSFET" principle depicted in FIG. 1d. Unlike the conventional current sensor 60 of FIG. 2, the inventive current sensor 200 does not measure the current continuously over a period, but samples it at a specific point in time when the value of the current corresponds to its average value. Consequently, the fast operational amplifier 74 of FIG. 2 may be replaced by an economical and slow operational amplifier 240. A simple and fast (sample-and-hold) circuit 201 copies the voltage $V_{SW1}$ across at the power switch $M_1$ into a capacitor $C_{hold}$. The operational amplifier 240 regulates the voltage $V_{G(M1b)}$ at the control input 242 of the switch $M_{1b}$ such that the switch $M_{1b}$ regulates the voltage difference between the switched-on power switch $M_1$ and the sensor switch $M_{1a}$, i.e. that the working points of the two transistors M1 and M1a are matched in that, specifically, by way of example, the circuits 201 and 202 transmit the working point of the switching transistor M1 to the detection transistor $M_{1a}$, and/or sets the working point of the latter such that it operates in the same operating point as the former.

Figure 9:
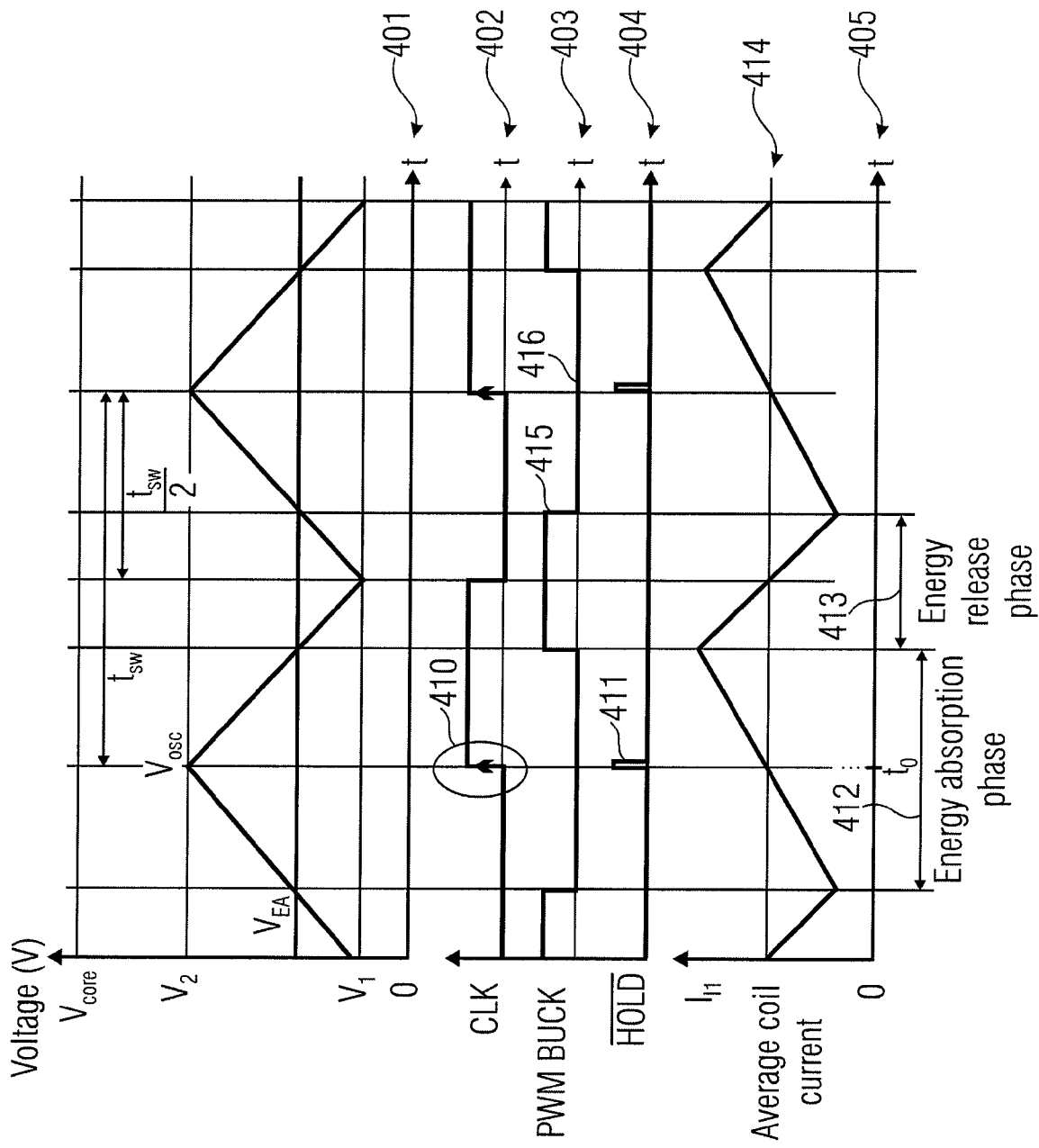
FIG. 9 shows time diagrams of control signals for an apparatus for sensing a current within a coil in accordance with embodiments of the invention.

If a MOSFET exhibiting a threshold voltage of almost 0 volts is employed for the switch $M_{1b}$, the voltage $V_{sense}$ between the reference node 209, for example ground $V_{SSA}$, and the battery voltage $V_{in}$ may vary. The sensor switch $M_{1a}$ is not switched. If the sensor switch $M_{1a}$ is implemented as a MOSFET, its gate 212 may be connected to the ground $V_{SSA}$. The fast (sample-and-hold) circuit 201 is controlled by an oscillator 260 which generates a square-wave signal CLK and a triangular-wave signal $V_{osc}$ in phase, as is shown in FIG. 6a, FIG. 6b and FIG. 9.

Figure 3:
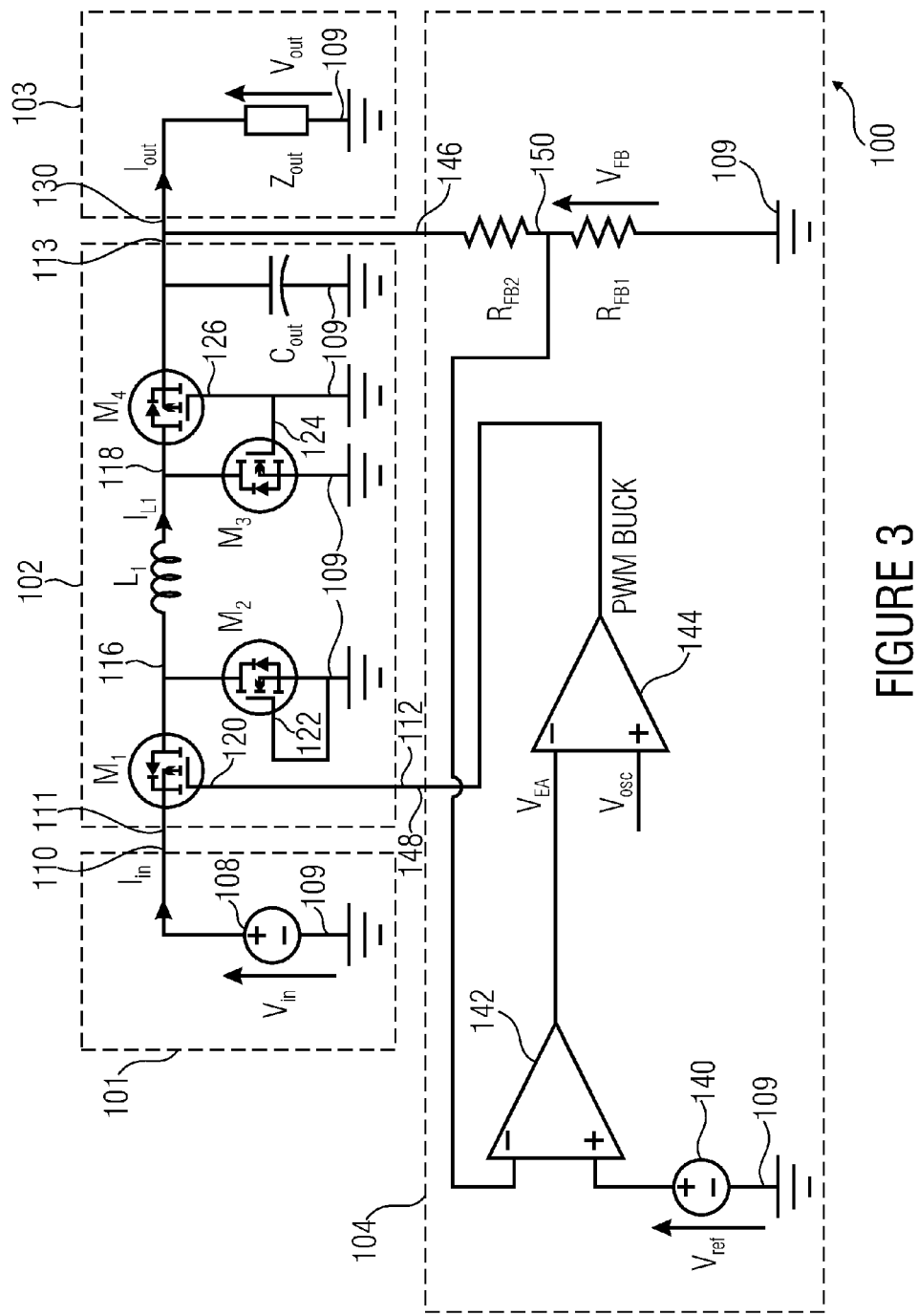
FIG. 3 shows a circuit diagram of a conventional DC/DC voltage converter in a full-bridge topology.

In the full-bridge topology 100, as is depicted in FIG. 3, the inventive current sensor 200 may be implemented in a particularly advantageous manner, since, because of the dynamic potentials at both terminals 116, 118 of the power coil $L_1$, simple sensor circuits, e.g. as depicted in FIG. 1a and FIG. 1c, basically can hardly be implemented. The inventive current sensor 200 is designed for being used in a full bridge 100, but it is not limited thereto. It may be utilized in any topology wherein the current supplies a coil via a power switch in a so-called continuous conduction mode (CCM). The so-called discontinuous conduction mode (DCM) may also be applied. In this case, however, an additional circuit may be used for evaluating the average current.

Figure 6A:
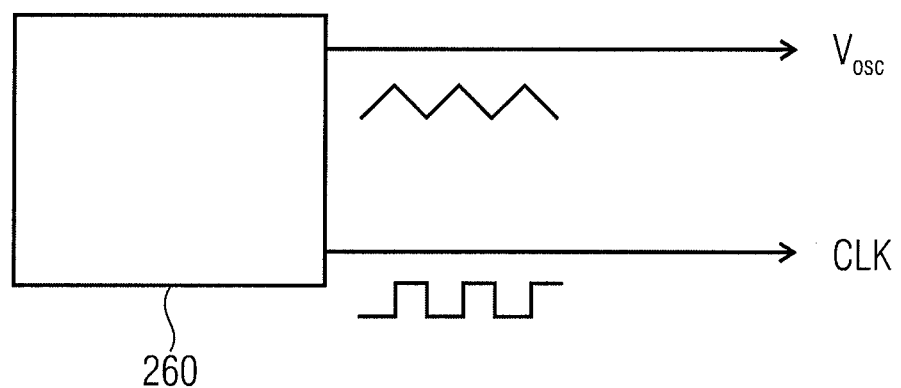
FIG. 6a shows a block diagram of an oscillator for generating control signals for an apparatus for sensing a current within a coil in accordance with an embodiment of the invention.

FIG. 6a shows a block diagram of a signal generator 260 for generating a triangular oscillator voltage $V_{osc}$ and a square clock signal CLK derived therefrom, i.e. a triangular-signal oscillator. The oscillator voltage $V_{osc}$ may be supplied, for example, to the second operational amplifier 144 of the pulse width modulation control circuit 104 of FIG. 3 so as to effect inventive sensing of the current $I_{L1}$ within the coil $L_1$. Using the clock signal CLK, an apparatus 200 of FIG. 5 may be controlled while using the circuits described in the following FIGS. 7 and 8 so as to sense the coil current $I_{L1}$. For example, the first input 210 of the apparatus 200 may be connected to the first input 111 of the H bridge circuit 102, and the second input 213 of the apparatus 200 may be connected to the first branching node 116 of the H bridge circuit 102 so as to measure, at the output 216 of the apparatus 200, a current or a voltage which corresponds to the coil current $I_{L1}$. Circuits for determining the gate control signal $\Phi$ and the inverse gate control signal $\overline{\Phi}$ from the clock signal CLK of the voltage oscillator 260 are depicted in the following figures.

Figure 6B:
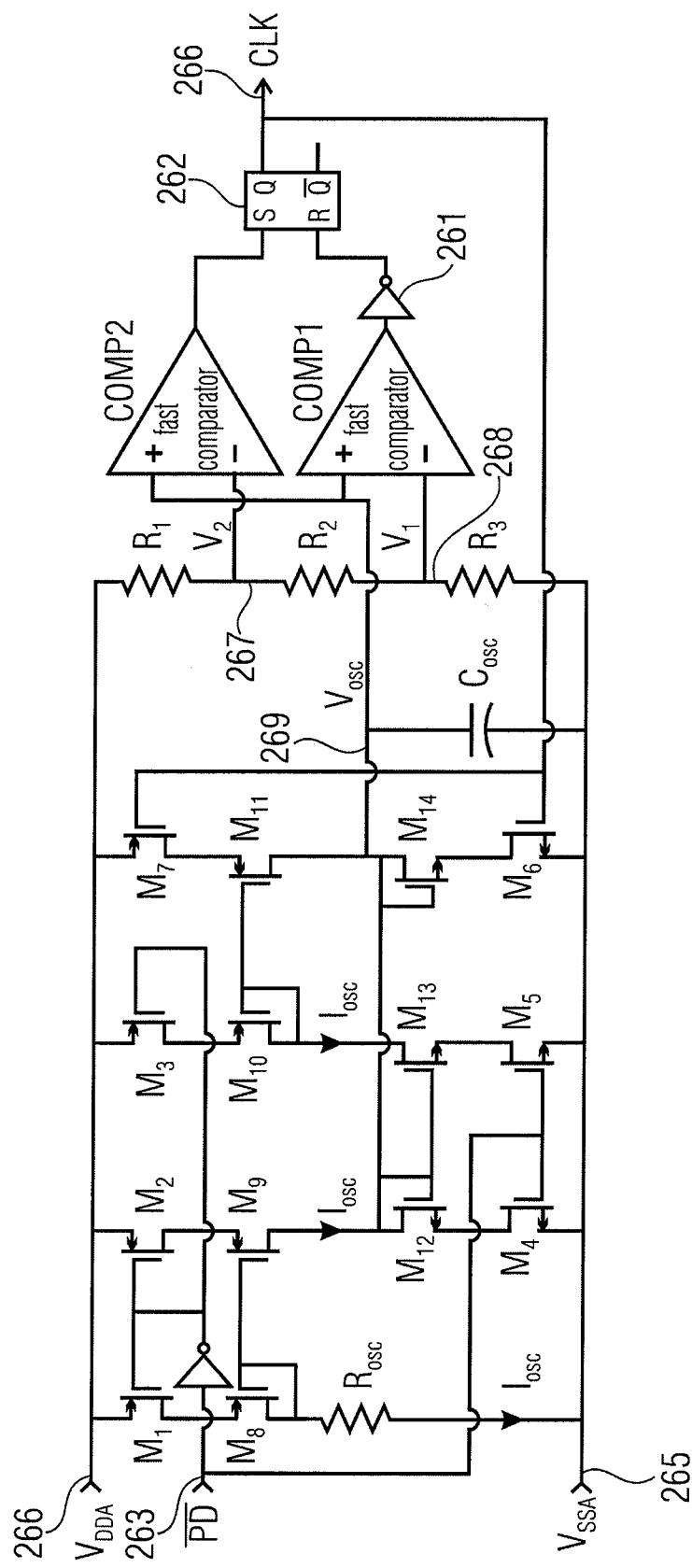

An example of a signal generator 260, i.e. of a triangular-signal oscillator, is shown in FIG. 6b. In FIG. 6b, $V_{DDA}$ and $V_{CORE}$ designate the supply voltage, and $V_{SSA}$ designates the ground, or a reference potential. The oscillator of FIG. 6b comprises transistors $M_1$ to $M_{14}$, resistors R1, R2, R3, Rosc, a capacitor $C_{osc}$, comparators COMP1 and COMP2, an inverter 261 and a RS flip-flop 262, which are wired between inputs 263-265 and an input 266, as is shown in FIG. 6b. The transistors M1, M2, M3, M4, M5 act as switches and are controlled by a power-down signal PD at the input 262. They are coupled to $V_{SSA}$ and VDDA such that they enable, by means of the signal PD, switching off the triangular-signal oscillator. The transistors M6 and M7 are also used as a switch in each case. In the case of FIG. 6b, the transistors M1, M2, M3, M7, M8, M9, M10, M11 are PMOS transistors, by way of example, and the transistors M4, M5, M6, M12, M13, and M14 are NMOS transistors, by way of example. Along with the resistor Rosc, the transistor M8 forms a current source whose current value is $I_{osc}$. The latter determines the switching frequency of the signals Vosc and CLK. The pair of transistors M8 and M9 mirror the current $I_{osc}$, as do pairs M12, M13, and M12, M14, and M10, M11. The comparators COMP1 and COMP2 are advantageously two fast comparators. The transistors M11 and M14, in turn, serve as a constant current source. However, only one of them is active at any one time. Which of the two transistors M11, M14, or current sources, is active is determined by the switches M6 and M7, which are serially connected between VDDA or $V_{SSA}$ and the respective transistor M11 or M14, and whose respective control terminal is coupled to the output 266. When the transistor M7 is switched on, the capacitor Cosc, which is connected between the transistors M11 and M14 on the one hand, and $V_{SSA}$ on the other hand, is discharged with a current of the amount of $I_{osc}$, which leads to a falling edge of Vosc, as may be seen in FIG. 9. By means of the resistors R1, R1, R3, which are connected in series between VDDA and $V_{SSA}$, reference voltages V1 and V2 are defined at the intermediate nodes 267 and 268, which reference voltages V1 and V2 are also depicted in FIG. 9 and are present at a respective one of the inverting input of the comparators COMP1 and COMP2, whereas the respective non-inverting input of the comparators is coupled to the circuit node 269, via which the capacitor $C_{osc}$ is coupled to the two transistors M11 and M14. The output of the comparator COMP2 is coupled to the set input, and the output of the comparator COMP1 is coupled, via the inverter 261, to the reset input of the RS flip-flop. The signals, i.e. the triangular-wave signal Vosc and the square-wave signal CLK, which are generated by the circuit of FIG. 6b in the switched-on state, i.e. $\overline{PD}=1$, are mutually synchronous.

While common DC/DC converters utilize sawtooth oscillators so that the expenditure of the circuit design is kept to a minimum, the inventive current sensor 200 is combined, in a particularly advantageous embodiment, as is depicted in FIGS. 6a and 6b and/or FIG. 9, with a symmetrical carrier signal $V_{osc}$ and a square-wave signal (or clock signal) CLK. The edges of the square-wave signal are synchronized with the carrier signal. In order to generate and synchronize these signals, a triangular-signal oscillator may be employed.

Figure 7:
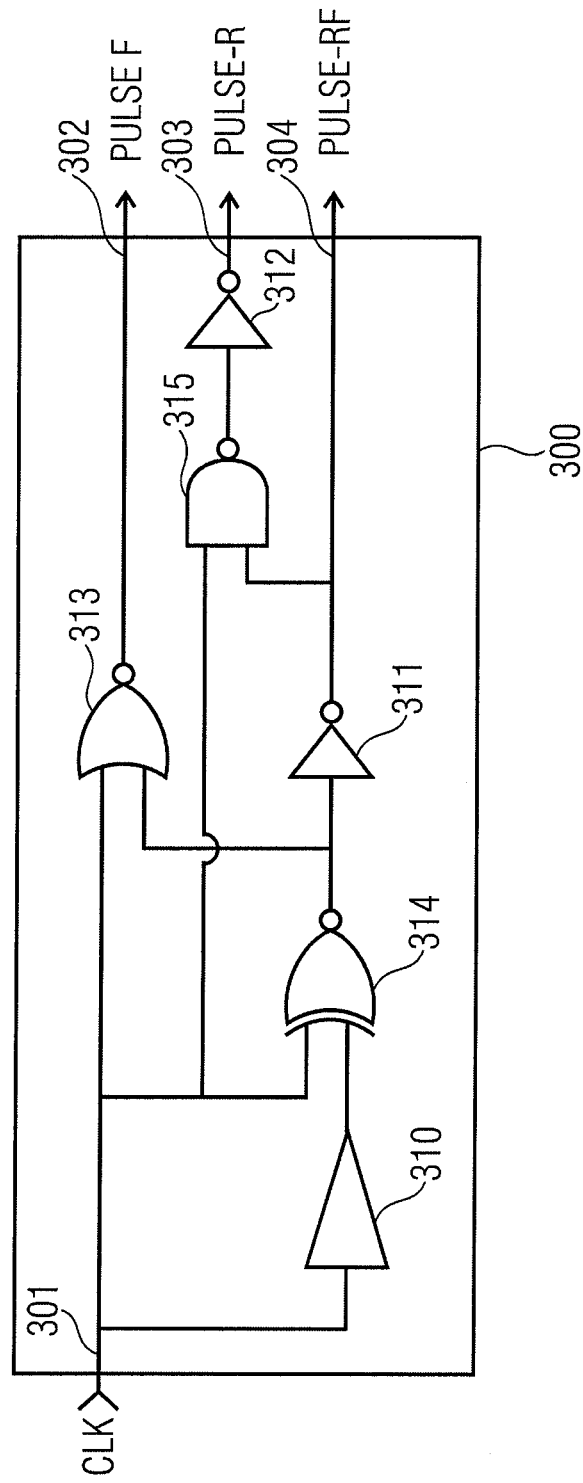
FIG. 7 shows a circuit diagram of a pulse generator for generating control signals for an apparatus for sensing a current within a coil in accordance with an embodiment of the invention.
Figure 8:
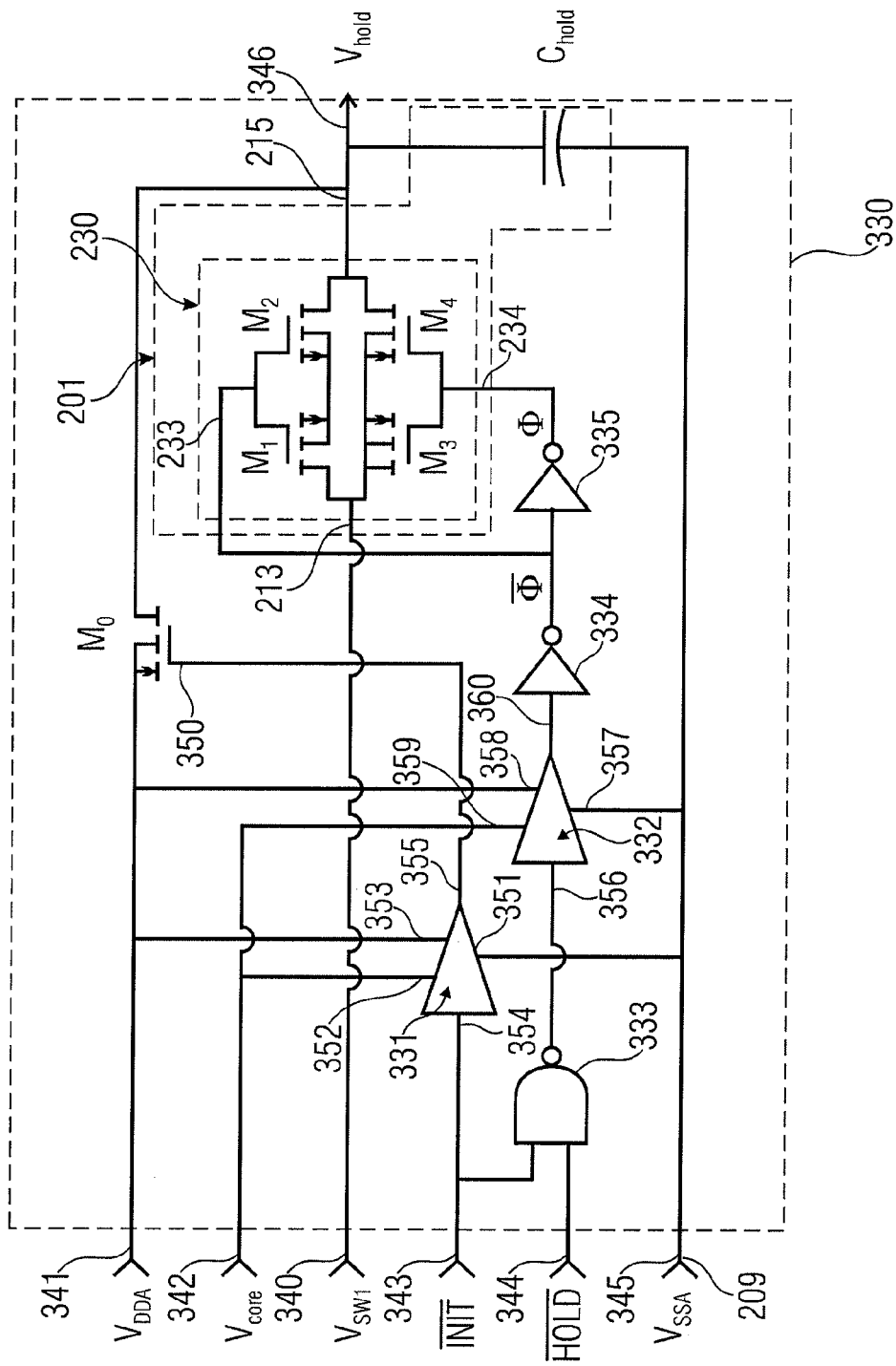
FIG. 8 shows a circuit diagram of a (sample-and-hold) circuit for providing a voltage across a switching transistor during a current sensing period in accordance with an embodiment of the invention.

A potential embodiment of the fast (sample-and-hold) circuit 201 is depicted in FIG. 8. A potential embodiment of the circuit of the pulse generator 300 is depicted in FIG. 7. These two circuits are the only parts of the inventive current sensor 200 that should have high speeds.

FIG. 7 shows a pulse generator 300 for generating pulse-shaped output signals in accordance with an embodiment of the invention. The pulse generator 300 comprises an input 301 at which the clock signal CLK (in accordance with FIGS. 6a and 6b) is applied, and three outputs at which three pulse-shaped output signals are provided. A first pulse-shaped output signal PULSE F is provided at a first output 302, a second pulse-shaped output signal PULSE R is provided at a second output 303, and a third pulse-shaped output signal PULSE RF is provided at a third output 304.

The pulse generator 300 comprises a delay member 310, a first inverter 311, a second inverter 312, a NOR gate 313, an exclusive NOR gate 314, and NAND gate 315. The gates are used for performing the respective logical operations. The delay member 310 is connected between the input 301 of the pulse generator 300 and a second input of the exclusive NOR gate 314. The first inverter 311 is connected between the output of the exclusive NOR gate 314 and the third output 304 of the pulse generator 300. The second inverter 312 is connected between an output of the NAND gate 315 and the second output 303 of the pulse generator 300. The NOR gate 313 is connected, with a first input, to the input 301 of the pulse generator 300, is connected, with a second input, to the output of the exclusive NOR gate 314, and is connected, with an output, to the first output 302 of the pulse generator 300. The exclusive NOR gate 314 is connected, with a first input, to the input 301 of the pulse generator 300, is connected, with the second input, to the output of the delay member 310, and is connected, with an output, to the input of the first inverter 311 and to the second input of the NOR gate 313. The NAND gate 315 is connected, with a first input, to the input 301 of the pulse generator 300, is connected, with a second input, to the output of the first inverter 311, and is connected, with an output, to the input of the second inverter 312.

The pulse-shaped output signals PULSE F, PULSE R and PULSE RF may be used as input signals of a circuit of FIG. 8.

If the switches ($M_1$, $M_2$, $M_3$, $M_4$) in the full bridge 100 of FIG. 3 are switched at a switching frequency of 10 MHz in the buck mode, for example at a sampling ratio (D) of 20%, the switch $M_1$ is switched on for 20 ns during each period. If a symmetrical triangular carrier signal $V_{osc}$ is used, an edge is generated on the clock output (CLK) by the switch $M_1$ after 10 ns of an on period. The pulse generator 300 converts this edge to a single logic pulse available at the three outputs (Pulse F, Pulse R, Pulse RF), depending on whether the edge of CLK is a rising or a falling edge. A pulse is output on Pulse F if a falling edge has been detected on CLK. A pulse is output on Pulse R if a rising edge was detected on CLK. A pulse is output on Pulse RF if a falling or rising edge was detected on CLK.

By way of example, FIG. 8 shows a sample-and-hold circuit, or SH-circuit, 330 for sampling the value of the voltage $V_{SW1}$ and storing same in a capacitor $C_{hold}$. The circuit 330 comprises a circuit 201 which corresponds to the circuit 201 of FIG. 5, which comprises an input 213 and an output 215. The circuit 330 may be employed in the apparatus 200 of FIG. 5 instead of the circuit 201. The circuit 330 further comprises a first potential converter 331, a second potential converter 332, a NAND gate 333, a first inverter 334, a second inverter 335, and a starting transistor $M_0$. The circuit 201 comprises a series connection of a first transistor $M_1$ and a second transistor $M_2$ which is connected in parallel to a series connection of a third transistor $M_3$ and a fourth transistor $M_4$ between the input 213 and the output 215. The control inputs of the first transistor $M_1$ and the second transistor $M_2$ are interconnected and form an inverting gate control input 233 of the circuit 201 so as to receive the inverse gate control signal $\overline{\Phi}$. The control inputs of the third transistor $M_3$ and the fourth transistor $M_4$ are interconnected and form a gate control input 234 of the circuit 201 so as to receive the gate control signal $\Phi$.

The circuit 330 comprises an input 340 which is connected to the input 213 of the circuit 201 and at which the voltage $V_{SW1}$ is present. The voltage $V_{SW1}$ corresponds to the voltage $V_{SW1}$ of FIG. 5, which drops at the branching node 226. The circuit 330 comprises a first control input 341 at which a positive supply voltage $V_{DDA}$ is present. The circuit 330 comprises a second control input 342 at which a processor voltage $V_{core}$ is present. The circuit 330 comprises a third control input 343 at which an inverse initialization signal $\overline{INIT}$ is present. The circuit 330 comprises a fourth control input 344 at which an inverse hold signal $\overline{HOLD}$ is present. The circuit 330 further comprises a fifth control input 345 wired to a reference node 209 at which a reference voltage $V_{SSA}$, for example ground, is present. The circuit 330 comprises an output 346 which is connected to the output 215 of the circuit 201 and has a holding voltage $V_{hold}$ provided thereat.

The NAND gate 333 is connected, with a first input, to the third control input 343 of the circuit 330, is connected, with a second input, to the fourth control input 344 of the circuit 330, and is connected, with an output, to an input of the second potential converter 332. The first potential converter 331 is connected, with an input, to the third control input 343 of the circuit 330 and is connected, with an output, to a control input 350 of the starting transistor $M_0$. The first potential converter 331 comprises a reference control input 351 connected to the fifth control input 345 of the circuit 330. The first potential converter 331 further comprises a supply voltage input 353 connected to the first control input 341 of the circuit 330. The first potential converter 331 comprises a potential control input 352 connected to the second control input 342 of the circuit 330. The first potential converter 331 is designed to convert a voltage at its input 354 to the potential of a voltage at its potential control input 352 and to provide it as a voltage at its output 355.

The second potential converter 332 comprises an input 356 connected to an output of the NAND gate 333. The second potential converter 332 comprises an output 360 connected to an input of the first inverter 334. The second potential converter 332 comprises a reference control input 357 connected to the fifth control input 345 of the circuit 330. The second potential converter 332 comprises a supply voltage input 358 connected to the first control input 341 of the circuit 330. The second potential converter 332 comprises a potential control input 359 connected to the second control input 342 of the circuit 330. The second potential converter 332 is designed to convert a voltage at its input 356 to the potential at its potential control input 359 and to provide it at its output 360.

The first inverter 334 is connected, with its input, to the output 360 of the second potential converter 332 and is connected, with its output, to an input of the second inverter 335 and to the inverting gate control input 233 of the circuit 201. The second inverter 335 is connected, with its input, to the output of the first inverter 334, and is connected, with its output, to the gate control input 234 of the circuit 201. The gate control signal $\Phi$ is provided at the output of the second inverter 335, the inverse gate control signal $\overline{\Phi}$ is provided at the output of the first inverter 334. The starting transistor $M_0$ is connected between the first control input 341 of the circuit 330 and the output 346 of the circuit 330.

The starting transistor $M_0$ comprises a starting transistor control input 350 connected to the output 355 of the first potential converter 331.

The pulse outputs (Pulse F or Pulse R) are connected at the digital input $\overline{HOLD}$ of the fast (sample-and-hold) circuit 201 of FIG. 5. If $\overline{HOLD}$ is not active, the voltage $V_{SW1}$ is sampled and stored in the capacitor $C_{hold}$. If $\overline{HOLD}$ is active, the sampled voltage $V_{hold}$ is held in the capacitor $C_{hold}$. For initializing, the digital signal INIT is employed, so that the switch (starting transistor) $M_0$ may load the voltage $V_{hold}$ at the capacitor $C_{hold}$ to the supply voltage $V_{DDA}$ as fast as possible. To set the digital signals $\overline{INIT}$, $\overline{HOLD}$ from the internal supply voltage $V_{core}$ high to the external supply voltage $V_{in}/V_{DDA}$, fast logic buffers 331, 332 or potential converters are employed.

The transmission gate 230 in the fast (sample-and-hold) circuit 201 in FIG. 8 comprises two PMOS transistors ($M_1$, $M_2$) and two NMOS transistors ($M_3$, $M_4$). The two PMOS transistors connected in series are connected in parallel with the two NMOS transistors connected in series and are connected to the input 213 and the output 215 of the transmission gate 220 in accordance with a complementary transistor circuit. With this symmetric implementation, the clock feedthrough effect is partly compensated for. However, this also enables sampling the voltage $V_{SW1}$ over the entire voltage range (from $V_{SSA}$ to $V_{in}/N_{DDA}$). The fast (sample-and-hold) circuit 201 suggested here may be employed for sampling the voltage $V_{SW1}$ both on the high-side and on the low-side.

FIG. 9 shows time diagrams of control signals for an apparatus for sensing a current within a coil in accordance with an embodiment of the invention. Five time diagrams 401, 402, 403, 404, 405 of control signals are shown. A first time diagram 401 illustrates the time waveform of the oscillator voltage $V_{osc}$, which may be generated, for example, by a signal generator 260 corresponding to the signal generator 260 of FIGS. 6a and 6b, and comprises a triangular waveform. The oscillator voltage $V_{osc}$ depicts a triangular waveform between a lower voltage value $V_1$ and an upper voltage value $V_2$ with a period $t_{SW}$, the oscillator voltage $V_{osc}$ being symmetrical to half the period $t_{SW}/2$. The oscillator voltage $V_{osc}$ is below the internal supply voltage $V_{core}$ and above the ground potential. The first time diagram 401 further shows the time waveform of a fault voltage $V_{EA}$ which corresponds, e.g., to the fault voltage $V_{EA}$ of FIG. 3. The fault voltage $V_{EA}$ and the oscillator voltage $V_{osc}$ are, for example, input signals for the comparator 144 of the pulse width modulation control circuit 104 in accordance with FIG. 3. The oscillator voltage $V_{osc}$ may be applied, for example, at the positive input of the comparator 144, and the fault voltage $V_{EA}$ may be applied at the negative input of the second operational amplifier 144. While conventional oscillator voltages for controlling the pulse width modulation control circuit 104 of FIG. 3 have a sawtooth-shaped waveform, the oscillator voltage $V_{osc}$ of FIG. 9 has a triangular waveform which is symmetrical to the voltage axis.

The second time diagram 402 shows the time waveform of the square-wave clock signal CLK. The clock signal CLK has a rising edge in response to a maximum value of the oscillator voltage $V_{osc}$, and a falling edge in response to a minimum value of the oscillator voltage $V_{osc}$. Because of the symmetrical waveform of the oscillator voltage $V_{osc}$, the clock signal CLK is periodic and square. The clock signal CLK is, for example, an input signal of the pulse generator 300 of FIG. 7.

The third time diagram 403 shows the time response of the control signal PWM BUCK at the output of the comparator 144, which, as will be explained later on, effects an energy input to the coil, or a process of the energy output of the coil, depending on which state is taken by said control signal PWM BUCK.

A fourth time diagram 404 shows the time response of the control signal $\overline{HOLD}$, the control signal $\overline{HOLD}$ comprising a short-time signal pulse 411 in response to a rising edge 410 of the clock signal CLK. The control signal $\overline{HOLD}$ corresponds, for example, to the first pulse-shaped output signal PULSE F of the pulse generator 300 of FIG. 7. However, it may also be generated from the second pulse-shaped output signal PULSE R or from the third pulse-shaped output signal PULSE RF of the pulse generator 300. The control signal $\overline{HOLD}$ may be received, for example, at the fourth control input 344 of the circuit 330 of FIG. 8. With the control signal $\overline{HOLD}$, the gate control signal $\Phi$ and the inverse gate control signal $\overline{\Phi}$ may be generated, for example with a circuit 330 of FIG. 8.

The fifth time diagram 405 shows the time waveform of the coil current $I_{L1}$. The coil current $I_{L1}$ shows a linearly rising waveform over an energy absorption phase 412 and a linearly falling waveform over an energy release phase 413. An average coil current 414 is set via the energy absorption phase 412 and via the energy release phase 413. Depending on the control signal PWM BUCK, a slow energy absorption phase 412 and a fast energy release phase 413 result. The control signal PWM BUCK is in a first state 415 to drive an energy release phase 413 of the coil $L_1$, and is in a second state 416 to drive an energy absorption phase 412 of the coil $L_1$. The first state 415 and the second state 416 of the control signal PWM BUCK is driven by the differential signal from the fault voltage $V_{EA}$ and the oscillator voltage $V_{osc}$ in accordance with the first time diagram. In the case of a positive difference, the control signal PWM BUCK is set in the first state 415, in the case of a negative difference, the control signal PWM BUCK is set in the second state 416. The control signal PWM BUCK corresponds to the control signal PWM BUCK of the pulse width modulation control circuit 104 of FIG. 3 and is generated by the comparator 144 as a difference between the oscillator voltage $V_{osc}$ and the fault voltage $V_{EA}$. Because of the symmetrical waveform of the oscillator voltage $V_{osc}$, the control signal $\overline{HOLD}$ is generated at a predetermined point in time to during the current sensing period $t_{SW}$, at which point in time to the coil current $I_{L1}$ adopts its average value 414. A circuit 200 of FIG. 4 provides the voltage $V_{SW1}$ across the switching transistor $M_1$, for example at the predetermined point in time to at which the coil current $I_{L1}$ corresponds to the average coil current 414. Thus, in response to the voltage $V_{hold}$ provided by the circuit 201, a control element 202 outputs an output signal $V_{sense}$ which corresponds to the current $I_{L1}$ to be sensed.

Utilization of a symmetric triangular-wave carrier signal $V_{osc}$ so as to generate the PWM signal (PWM BUCK) enables automatically centering the clock edges in the center of the PWM signal pulses (PWM BUCK), as is depicted in FIG. 9. The oscillator has a switching period $t_{SW}$, and the carrier signal $V_{osc}$ oscillates between $V_1$ and $V_2$. In the so-called steady-state mode operation, the centering is almost ideal, since a rising clock signal edge 410 occurs at the predetermined point in time to, when the current $I_{L1}$ within the power coil $L_1$ has its average value 414. For dynamic centering of the pulse $\overline{HOLD}$, the symmetry of the carrier signal $V_{osc}$ is exploited. With a symmetric triangular-wave carrier signal $V_{osc}$, the longest dead times become possible and are automatically generated prior to and after the pulse $\overline{HOLD}$ for sampling the current $I_{L1}$.

The inventive current sensor 200 was described in the buck configuration of the full bridge 100 of FIG. 3 when the DC/DC converter operates in the continuous conduction mode (CCM). However, the inventive current sensor 200 may also be employed in other configurations, such as boost or buck-boost configurations. Additional logic circuits may possibly also be used. It may also be operated in the discontinuous conduction mode (DCM), in which case an additional circuit may be used for calculating the average value 414 of the current $I_{L1}$.

An inventive current sensor 200 exhibits considerable advantages over a conventional current sensor 60. It uniquely combines the advantages of a current sensor 200, which measures the current $I_{D(M1)}$ across the power switches $M_1$ in a nearly lossless manner (without introducing a series resistance into the power path of the converter) with the low energy consumption of an operational amplifier 240, which has a low bandwidth.

Unlike the conventional current sensors, which continuously measure the voltage across the power switch, in accordance with FIG. 1b and FIG. 1d, the inventive current sensor 200 samples the voltage $V_{SW1}$ only at a specific point in time to in each period $t_{SW}$ across a (sample-and-hold) circuit 201. This method mainly offers the four advantages listed below:

The operational amplifier 240 has an entire period $t_{SW}$ available to it in order to achieve the output value $V_{hold}$, which enables utilization of a low-power operational amplifier 240. A direct consequence of this is a clearly reduced energy consumption as compared to an operational amplifier 74 of a conventional current sensor 60 of FIG. 2, which should have a high bandwidth.

The average value 414 of the current $I_{L1}$ is measured directly, without a more or less costly calculation of a mean value. This saves further energy without limiting the functionality, since the present current value would only be interesting for short-circuit monitoring, which may also be realized using the inventive current sensor 200, however. The average current 414 measured is the average current flowing through the coil $L_1$, rather than the average current flowing through the power switch $M_1$.

No dead times due to transients or switching operations need to be taken into account since sampling of the average current is effected precisely halfway through the ON period of the switch, as is depicted in FIG. 9. The duration of a sampling pulse is short enough so that it can be neglected as compared to the switching frequency of the converter.

The current $I_{sense}$ to be measured is not noisy, since the sensor switch $M_{1a}$ at which it is measured is not switched.

An inventive current sensor 200 may be advantageously employed in power converters which may use the present average current value, e.g. in DC/DC converters which employ different modulations, for example pulse width modulation (PWM), pulse frequency modulation (PFM), etc., depending on the current range in which they are being operated, i.e. nominal-load range or low-load range.

Embodiments of the invention provide a method for low-consumption measurement of the current $I_{L1}$ across a switched power switch $M_1$ in a power converter. The current sensor 200 may be realized in a discrete or in an integrated manner. The active switch $M_1$ may be configured as a metal-oxide semiconductor field-effect transistor (MOSFET), as a bipolar transistor (BJT), or as a bipolar transistor having an insulated gate electrode (IGBT). The sensor switch $M_{1a}$ is not switched, but is at a fixedly defined potential, for example at ground. The average current 414 need not be calculated. The value of the average current 414 may be sampled directly. The converter may operate in the continuous conduction mode (CCM), but it may also operate in the discontinuous conduction mode (DCM).

A method of sensing a current $(I_{L1})$ within a coil $(L_1)$, said current $(I_{L1})$ being applied to the coil (L1) such that it is switched via a switching transistor $(M_1)$, comprises the steps of: "sensing the current $(I_{L1})$ using a detection transistor $(M_{1a})$", "providing a voltage $(V_{hold})$ which corresponds to the voltage $(V_{SW1})$ across the switching transistor $(M_1)$ at a predetermined point in time $(t_0)$ during a current sensing period $(t_{SW})$", "matching working points of the switching transistor $(M_1)$ and of the detection transistor $(M_{1a})$ in response to the voltage $(V_{hold})$ provided", and "outputting an output signal $(V_{sense})$ which corresponds to the current $(I_{L1})$ to be sensed".

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for sensing an average value of a switched current within a coil, wherein said current may be applied to the coil such that it is switched via a switching transistor, the apparatus comprising:
    a detection transistor;
    a circuit configured to sample, at a predetermined point in time, a voltage which corresponds to a voltage across the switching transistor, and to provide a holding voltage; and
    a control element configured to match, in response to the holding voltage provided by the circuit, the working points of the switching transistor and of the detection transistor, and to output, as a function of a current through the detection transistor, an output signal which is a measure of the average value of the switched current.

2. The apparatus as claimed in claim 1, wherein the circuit comprises:
    a gate element; and
    a storage element,
    the gate element being configured to transmit, in response to a gate control signal, the voltage, which is present at an input of the circuit, to the storage element,
    the storage element being configured to provide the stored voltage to the control element at an output, and
    the gate control signal effecting the transmission at the predetermined point in time.

3. The apparatus as claimed in claim 2, wherein the gate element comprises:
    a transmission gate comprising a plurality of complementary transistors driven via the gate control signal to transmit the voltage present at the input of the circuit.

4. The apparatus as claimed in claim 2, wherein the storage element comprises:
    a capacitor configured to store the voltage, which has been transmitted from the gate element, at least for the duration of a current sensing period.

5. The apparatus as claimed in any of the previous claims, wherein the predetermined point in time is a point in time when the voltage across the switching transistor comprises a mean value over the current sensing period.

6. The apparatus as claimed in claim 1, wherein the circuit being configured to provide the voltage across the switching transistor halfway through the ON period of the switching transistor in each case.

7. The apparatus as claimed in claim 1, wherein the detection transistor is not switched.

8. The apparatus as claimed in claim 1, wherein the detection transistor and the switching transistor are of the same transistor type, the switching transistor and the detection transistor being configured such that a current which is smaller, by a factor of 10 to 10,000, than a current flowing through the switching transistor flows through the detection transistor.

9. The apparatus as claimed in claim 1, wherein the switching transistor and the detection transistor are a MOSFET, a BJT, or an IGBT.

10. The apparatus as claimed in claim 1, wherein the control element comprises an operational amplifier comprising a bandwidth which corresponds to the current sensing period.

11. The apparatus as claimed in claim 1, wherein the control element comprises:
    a resistor control circuit configured to provide a control signal as a function of the current sensed by the detection transistor and in response to the voltage provided by the circuit; and
    a resistor which is controllable as a function of the control signal and is connected between the detection transistor and an output of the control element.

12. The apparatus as claimed in claim 11, wherein the control element further comprises:
    a detection resistor connected between the output of the control element and a reference node,
    the resistor control circuit being configured to provide the control signal such that a current flows through the detection resistor, said current corresponding to a present mean value of the current within the coil.

13. The apparatus as claimed in claim 11, wherein the controllable resistor comprises a control transistor.

14. The apparatus as claimed in any of the previous claims, comprising a correction circuit which provides the sensed current with a correction factor so as to effect an adaptation of the sensed current to a mean value of the current within the coil.

15. A method of sensing an average value of a switched current within a coil, said current being applied to the coil such that it is switched via a switching transistor, the method comprising:
   providing a holding voltage,
   wherein providing the holding voltage comprises sampling and holding a voltage which corresponds to a voltage across the switching transistor;
   matching working points of the switching transistor and of a detection transistor in response to the holding voltage provided; and
   outputting an output signal, which is a measure of the average value of the switched current, as a function of a current through the detection transistor.

16. An apparatus for sensing a current within a coil, said current being applied to the coil such that it is switched via a switching transistor, the apparatus comprising:
   a detection transistor for sensing the current;
   a circuit providing, at a predetermined point in time, a voltage which corresponds to a voltage across the switching transistor; and
   a control element which matches, in response to the voltage provided by the circuit, the working points of the switching transistor and of the detection transistor, and outputs an output signal which corresponds to the current to be sensed.

17. A method of sensing a current within a coil, said current being applied to the coil such that it is switched via a switching transistor, the method comprising:
   sensing the current using a detection transistor;
   providing a voltage which corresponds to the voltage across the switching transistor at a predetermined point in time;
   matching working points of the switching transistor and of the detection transistor in response to the voltage provided; and
   outputting an output signal which corresponds to the current to be sensed.

* * * * *